United States Patent [19]

Isogai et al.

[11] 4,394,657
[45] Jul. 19, 1983

[54] DECODER CIRCUIT

[75] Inventors: Hideaki Isogai, Higashikurume; Yukio Takahashi, Shiga, both of Japan

[73] Assignee: Fujitsu Limited, Kawasaki, Japan

[21] Appl. No.: 217,757

[22] Filed: Dec. 18, 1980

[51] Int. Cl.³ .................. H04Q 9/00; H03K 19/086; H03K 19/01; G11C 11/40
[52] U.S. Cl. .............................. 340/825.93; 307/463; 365/155
[58] Field of Search ...................... 340/825.93, 825.92; 307/463, 456; 365/155

[56] References Cited

U.S. PATENT DOCUMENTS 4,143,359  3/1979  Beelitz .......................... 340/825.92
4,276,485  6/1981  Rydval .............................. 307/463
4,344,005  8/1982  Stewart ............................. 307/463

Primary Examiner—Donald J. Yusko
Attorney, Agent, or Firm—Staas & Halsey

[57] ABSTRACT

A decoder circuit comprises input gates, a logic circuit for generating an output according to input signals, an output gate for driving a word line, and a current control device for activating the output gate according to the output of the logic circuit.

11 Claims, 8 Drawing Figures

DECODER CIRCUIT

BACKGROUND OF THE INVENTION

The present invention relates generally to decoder circuits, and more particularly to a decoder circuit effective upon use in word line selection within a semiconductor memory device.

In conventional decoder circuits, a so-called multi-emitter type decoder circuit, for example, has a resistor connected to the base of the word driver (transistor). Hence, when a load capacitance of a line that is connected to the emitter of this word driver is large like that of a word line, a large current must be passed through the base of the word driver through the above resistor upon selection of the word line connected to this word driver, because a large charging current must be supplied to the word line being selected. When the large charging current is flowing, the level of the base voltage of the word driver connected to the selected word line becomes high.

However, because the resistance of the above resistor is large and the load capacitance is present, a long time constant is created by the load capacitance, slowing down the rising characteristic of the base voltage of the above word driver.

One method of improving the rising characteristic of the above base voltage is to reduce the resistance of the above resistor, however, this will result in increased power consumption. Another method of sharpening the rise in the rising characteristic of the above base voltage is to reduce the word line capacitance, but, of course, the word line capacitance cannot be reduced arbitrarily.

SUMMARY OF THE INVENTION

An object of the present invention is to provide a novel and useful decoder circuit, in which the above mentioned problems have been overcome.

Another object of the present invention is to provide a decoder circuit of the multi-emitter type which includes inverters provided at output gates that invert outputs of logic circuits and constant current sources that form current switches together with each of a first resistor which acts as a load on the inverter. The decoder circuit also includes transistors that act as constant voltage sources and the inverters and driving transistors that supply current to the base of the above output stage transistors that are controlled by outputs of the above inverters. The decoder circuit also includes parallel circuits each having a second resistor connected between the above driving transistors and a biasing circuit and a diode for limiting the voltage between the terminals of the above second resistor. When the above logic circuit generates a low-level output, the bias level of the biasing circuit is applied to the base of the output stage transistor as low-level. When the logic circuit generates a high-level, the driving transistor is turned ON and a base current is directly supplied to the output stage transistor from the power source. According to the decoder circuit of the present invention, the rise in the operational speed characteristic of the word line can be made to have a sharper rise (faster operational speed).

Other objects and further features of the present invention will be apparent from the following detailed description when read in conjunction with the accompanying drawings.

DETAILED DESCRIPTION OF THE PREFERRED EMBODIMENT

Figure 1:
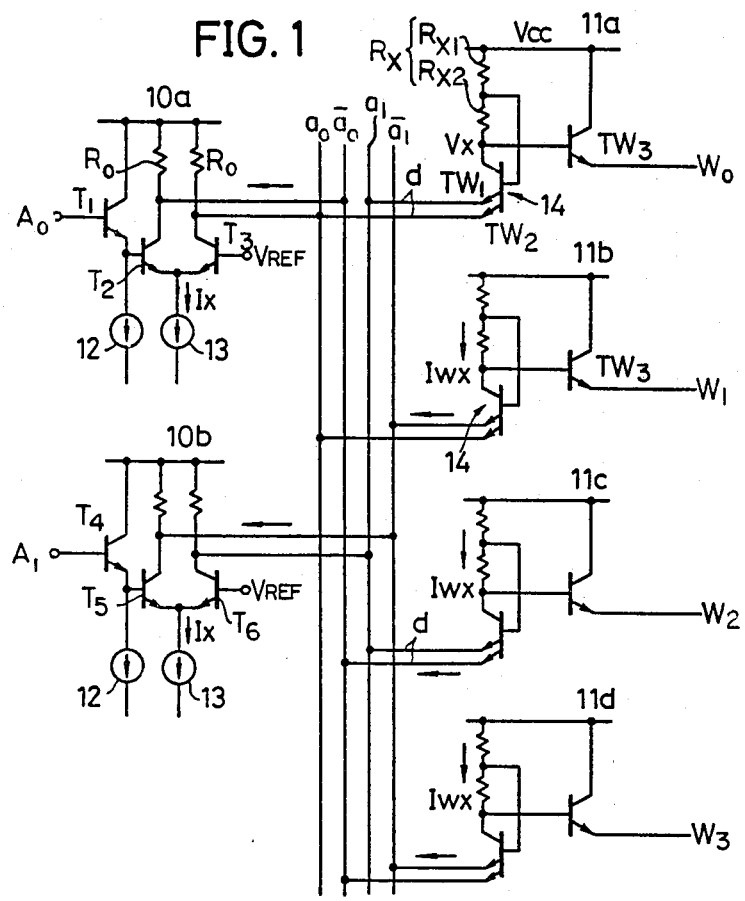
FIG. 1 is a circuit diagram showing one example of a conventional decoder circuit.

A conventional decoder circuit used in a word signal selection circuit within a semiconductor memory circuit, is shown in FIG. 1. The decoder circuit of FIG. 1 is a so-called multi-emitter type, and to simplify the description, a case where there are two inputs, is shown as an example.

Input gates 10a and 10b comprise transistors $T_1$ through $T_3$, and transistors $T_4$ through $T_6$, respectively, two load resistors $R_0$, and constant current sources 12 and 13. The input gates 10a and 10b generate signals $a_0$ and $a_1$, and generate inverted signals $\bar{a}_0$ and $\bar{a}_1$, from the input signals $a_0$ and $a_1$ respectively generated from input signal bits $A_0$ and $A_1$. On the other hand, output gates 11a through 11d respectively comprise multi-emitter type transistors $TW_1$ and $TW_2$ which form an AND-circuit 14, a load resistor $R_x$ (divided into resistors $R_{x1}$ and $R_{x2}$), and an output stage transistor (word driver) $TW_3$. The output gates 11a through 11d select two specific signals from the four signals $a_0$, $a_1$, $\bar{a}_0$, and $\bar{a}_1$, that is, $a_0$ and $a_1$, $a_0$ and $\bar{a}_1$, $\bar{a}_0$ and $a_1$, or $\bar{a}_0$ and $\bar{a}_1$, and generate a high-level output when the above two selected signals are both of high levels.

In this decoder circuit, one of the output gates 11a through 11d generates a high-level output, in dependence upon the combination of the signal levels of the inputs $a_0$ and $a_1$, and therefore, in this particular example, one of the word lines $W_0$ through $W_3$, is selected and made the high level. Hence, when the levels of both the inputs $a_0$ and $a_1$ are high, the transistors $T_2$ and $T_5$ (indicated by oblique lines) of the respective input gates 10a and 10b turn ON, and a current $I_{wx}$ respectively flows from both the transistors $TW_2$ of the output gates 11c and 11d as well as from both the transistors $TW_1$ of the output gates 11b and 11c.

The above current $I_{wx}$ can be described by the following equation (1), when the current which flows through the load resistors $R_0$ is designated by $I_1$.

$$I_{wx}=2(I_x-I_1)/3 \tag{1}$$

Accordingly, the output voltage $V_x$ of the AND-circuit 14 can be described by the following equation (2), where $V_{cc}$ is the power source voltage.

$$V_x=V_{cc}-I_{wx}(R_{x1}+R_{x2}) \tag{2}$$

The level of the above potential $V_x$ becomes low with respect to the transistors $TW_3$ of the output gates $11b$ through $11d$, and thus turns these transistors $TW_3$ into non-selected state, which results in a non-selection of the word lines $W_1$ through $W_3$.

On the other hand, the transistors $TW_1$ and $TW_2$ of the output gate $11a$ are applied with a high level voltage at their emitter junctions, and therefore, the current $I_{wx}$ does not flow from the transistor $TW_1$. Consequently, the potential $V_x$ becomes:

$$V_x \simeq V_{cc} \quad (3)$$

and the level of the word line $W_0$ becomes high, because the transistor $TW_3$ is turned into the selected state by the above high-level voltage $V_x$. When the levels of the input signals $a_0$ and $a_1$ change, the level of another output gate becomes high, and accordingly selects a specific word line.

However, since the resistor $R_x$ ($R_x = R_{x1} + R_{x2}$) is connected to the base of the transistor $TW_3$ of the emitter-follower type, when the load capacitance connected to its emitter is large like that of the word lines, it becomes necessary to supply a large charging current through the word line upon selection at which time the level of the potential $V_x$ is high. Accordingly, it becomes necessary to pass a large base current through the resistor $R_x$ to the base of the transistor $TW_3$, however, because the resistance of the resistor $R_x$ is large and the load capacitance is large, a long-time constant is created. Thus, the rising waveform of the base potential $V_x$ becomes one which is shown by a curve I of FIG. 2, having a slow rising characteristic.

Figure 2:
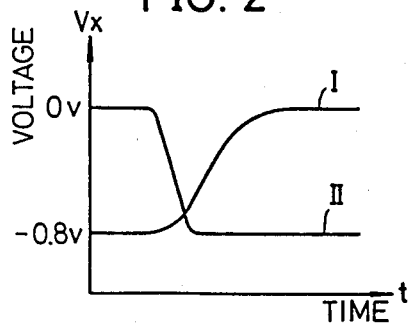
FIG. 2 is a graph showing an operational characteristic of the decoder circuit of FIG. 1.

A curve II in FIG. 2 shows the fall time characteristic of the base voltage of the transistor $TW_3$ on the non-selected side. Hence, the region to the right, beyond the intersection point of these curves showing the rise-time characteristic of the base voltage of the transistor $TW_3$ on the selected side and the fall-time characteristic of the base voltage of the transistor $TW_3$ on the non-selected side, is the region in which the read-out of information can be performed. One way to improve the rising characteristic of the curve, that is, to obtain a sharper rising characteristic, is to make the resistance of the resistor $R_x$ small. However, this will result in an increase in power consumption, and is not preferable. Another method would be to decrease the capacitance of the word lines, but of course, the capacitance of the word lines cannot be decreased arbitrarily.

The reason why the resistor $R_x$ is separated into two resistors, namely $R_{x1}$ and $R_{x2}$, is because the bases of the multi-emitter type transistors $TW_1$ and $TW_2$ are connected to the connecting point between these two series connected resistors $R_{x1}$ and $R_{x2}$, so that due to this connection, the amplitude (the voltage difference between the high and low states) of the decoder line d becomes small. Since this decoder line d has a large capacitance, the above small amplitude is effective in speeding-up the operational speed of the device. On the other hand, the base of the transistor $TW_3$ is connected to the power source $V_{cc}$ through the resistors $R_{x1}$ and $R_{x2}$, and as a result, the word line thus possesses a larger amplitude than that of the decoder line d $$\left( \text{amplitude of decoder line} = \frac{1}{\text{ratio between resistance values of resisters } R_{x1} \text{ and } R_{x2}} \right).$$

This is necessary in order to perform accurate operation of the memory cell, and it is not desirable to make this amplitude too small. Accordingly, the resistor $R_x$ is separated into these two resistors $R_{x1}$ and $R_{x2}$, in order to obtain a large word line amplitude and small decoder line amplitude, and in order to heighten the applied level and guarantee accurate and high-speed operation of the memory device.

Figure 3:
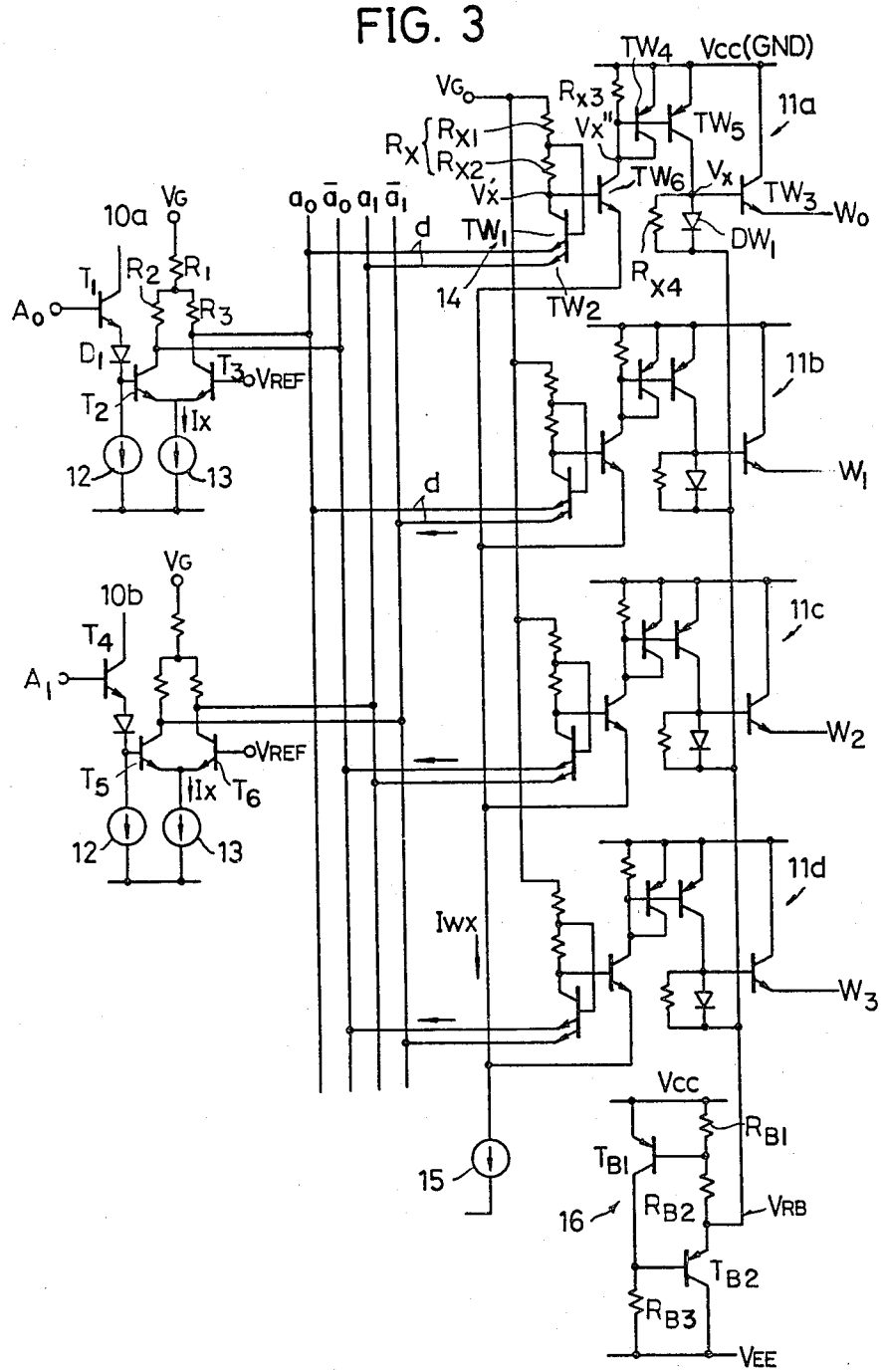
FIG. 3 is a circuit diagram showing an embodiment of a two-input decoder circuit of the present invention.

FIG. 3 shows an embodiment of a decoder circuit of the present invention connected to a two-input decoder circuit. In FIG. 3, those parts that are the same as those corresponding parts in FIG. 1 are designated by the like reference numerals, and their description will be omitted. An npn-type transistor $TW_6$, which acts as an inverter to invert an output $V_x'$ of the AND-circuit 14, is included in the output gate $11a$ (the same is true for the output gates $11b$ through $11d$). The transistors $TW_6$ at each output gates $11a$ through $11d$ and the constant current source 15 comprise a current switch. Only the transistor $TW_6$ of the output gate having an output $V_x'$ of the high level supplied thereto becomes ON, and the level of the collector potential $V_x''$ of the transistor $TW_6$ accordingly becomes low. A resistor $R_{x3}$ and a first pnp-type transistor $TW_4$ are connected in parallel between the transistor $TW_6$ and the power source voltage $V_{cc}$ (ground potential), and the base of the transistor $TW_4$ together with the base of a transistor $TW_5$ are connected to the collector of the transistor $TW_6$. Due to the above connections, the base potential $V_x''$ of the transistor $TW_5$ (also the collector potential of the transistor $TW_6$ as well as the base potential of the transistor $TW_4$) is held at a constant potential.

The transistor $TW_5$ is connected in series with a parallel circuit comprising a resistor $R_{x4}$ and a diode $D_{w1}$, and the series connection is connected between the power source voltage $V_{cc}$ and a standard biasing circuit 16, and the potential $V_x$, at the connection point between the collector of the transistor $TW_5$ and the resistor $R_{x4}$, is applied to the base of the transistor (word driver) $TW_3$. The parallel circuit comprising the resistor $R_{x4}$ and the diode $DW_1$, together with the standard biasing circuit 16, act as a voltage clamper which clamps the high-level voltage applied to the base of the transistor $TW_3$. This biasing circuit 16 comprises transistors $T_{B1}$ and $T_{B2}$, and resistors $R_{B1}$ through $R_{B3}$, and applies a constant voltage $V_{RB}$ ($-1.6$ volts) to one end of the resistor $R_{x4}$ as a biasing level.

The reason for employing the constant voltage circuit comprising the above transistor $TW_4$ and resistor $R_{x3}$ will now be explained. The potential $V_x''$ can be considered as being equal to "$V_{cc} - R_{x3} \cdot I_{wx}$," as clearly seen from FIG. 3, and when these values are constant, there is no need to provide a separate constant potential forming means. However, these values, especially the current which flows through the resistor $R_{x3}$, fluctuate due to the base current of the pnp-type transistor $TW_5$ (also of the transistor $TW_4$ in this example), assuming that the current $I_{wx}$ of the constant current source 15 is constant. Moreover, the characteristic of a pnp-type transistor, especially the $\beta$-gain, generally is very unstable, and accordingly, the base current of the transistor TW$_5$ is large, for example, the potential V$_x'$ rises because the current which flows through the resistor R$_{x3}$ becomes small. Hence, as a result, the base-to-emitter current of the transistor TW$_5$ becomes small, increasing the resistance of the transistor TW$_5$. Accordingly, not enough current is applied to the base of the transistor (word driver) TW$_3$, and this introduced similar problems to those of the circuit shown in FIG. 1. Therefore, the pnp-type transistor TW$_4$ is used to prevent the above problems, by varying its conductance according to the value of the potential V$_x''$, to hold this potential V$_x''$ at a constant value.

The operation of the decoder circuit of FIG. 3 will now be described for the same input conditions (a$_0$=a$_1$=high level) as those given upon description of the circuit of FIG. 1. When transistors T$_2$ and T$_5$ of the input gates 11a and 11b are turned ON, a current I$_x$ flows through these transistors T$_2$ and T$_5$. Furthermore, a circuit comprising a power source V$_G$ and resistors R$_1$ through R$_3$ connected at the output stages of the input gates 10a and 10b, comprises a current switch together with the transistors T$_2$ and T$_3$ and the source 13 of the constant current I$_x$, and also speeds up the turning-OFF operation of the transistors TW$_1$ and TW$_2$ of the AND-circuit 14. That is, when the transistors TW$_1$ and TW$_2$ turn OFF, their base potential V$_x'$ become equal to V$_G$. Therefore, the decoder wiring d returns to a high-level state by being charged through these transistors TW$_1$ and TW$_2$ that turn OFF, when the path formed by resistors R$_1$ through R$_3$ is not provided, but the rising characteristic of the circuit becomes slow due to the high resistance. However, when the system having the resistors R$_1$ through R$_3$ is provided, the charged current flows through this system, and speeds up the rising characteristic. Moreover, these resistors R$_1$ through R$_3$ prevent the high-level voltage of the decoder wiring from reaching to the voltage V$_G$, and restrains a voltage lowered by an amount equal to the base-to-emitter voltages V$_{BE}$ of the transistors TW$_1$ and TW$_2$. This as a result decreases the voltage amplitude of the decoder wiring d, and helps speed up the operation of the circuit.

When the level of the input signals a$_0$ and a$_1$ are both high, only the level of the output V$_x'$ of the AND-circuit 14 in the output gate 11b becomes high. Accordingly, the transistor TW$_6$ is turned ON, and flows a current through the power source V$_{cc}$, resistor R$_{x3}$, transistor TW$_6$, and constant current source 15 in that order. Hence, the level of the potential V$_x''$ becomes low, turning the transistors TW$_4$ and TW$_5$ ON, and the above current I$_{wx}$ from the current source 15 also flows in the transistors TW$_4$ and TW$_5$. Thus, when the emitter area of the transistors TW$_4$ and TW$_5$ are equal, the same amount of current flows through the transistor TW$_5$ as that through the transistor TW$_4$. This current then flows into the parallel circuit having the resistor R$_{x4}$ and diode D$_{w1}$.

The current which flows through the resistor R$_{x4}$ is in a slightly overdriven state (however, because of the clamping diode D$_{w1}$, the voltage V$_x$ is held to a voltage which is the sum of a voltage V$_{RB}$ and the forward voltage drop of the diode D$_{w1}$), in order to increase the rising speed of the potential V$_x$, so that the variation in the current due to the unstable α-cutoff frequency of the transistor TW$_5$ does not affect the high-level state of the potential V$_x$. When the level of the potential V$_x$ is high, the transistor (word driver) TW$_3$ is turned into the selected state, and its emitter potential also becomes high, resulting in the selection of the word line W$_0$ as in the case of the circuit shown in FIG. 1. Furthermore, a constant biasing level voltage V$_{RB}$ (−1.6 volts) from the biasing circuit 16 is applied to the bases of each of the transistors (word drivers) TW$_3$ of the output gates 11b through 11d having the transistors TW$_5$ that are turned into non-selected state through the resistor R$_{x4}$, and thus these transistors TW$_3$ are turned into non-selected state. Accordingly, the word lines connected to the above output gate 11b through 11d are not selected. On the other hand, the charging of the word line which is selected is of course performed through the transistor TW$_3$, and its base current is sufficiently supplied by the transistor TW$_5$, hence resulting in a very fast rise characteristic of the word line.

Figure 4:
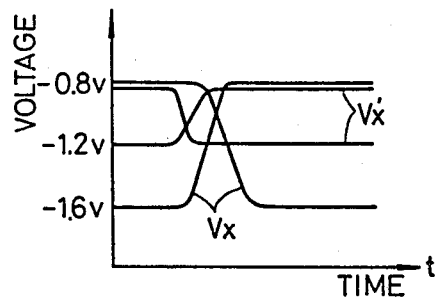
FIG. 4 is a graph showing an operational characteristic of the decoder circuit of FIG. 3.

FIG. 4 is a graph showing the variation in the output V$_x'$ of the AND-circuit 14 and the base potential V$_x$ of the transistor (word driver) TW$_3$. The rising characteristic of the base potential V$_x$ is a preferable one in which no sluggishness in seen as in the graph of FIG. 2. That is, when generally providing two output levels, the low level is obtained by connecting a resistor to a constant potential in order to reduce the current. Furthermore, the operational speed of a circuit, which provides a high-level output upon cut off of the current, becomes fast when the current is drastically reduced in order to obtain a low level, but the rising speed of the characteristic upon obtaining a high-level is determined by the resistance and the capacitance introduced thereon. The resistor R$_x$ of the circuit shown in FIG. 1 corresponds to the above resistance, and as stated above, this resistor R$_x$ is of high resistance and results in a slow rising characteristic of the word line.

In contrast to the above, a reverse operation is performed by the circuit of the present invention. Accordingly, the resistor R$_{x4}$ is connected to a constant potential V$_{RB}$, and transistor TW$_5$ is connected to the other end of the resistor R$_{x4}$. Hence, a high level is obtained by flowing a current through the above connected elements, and a low level is obtained by cutting off this current. By this current control operation, the value of the current can be made large since only one gate provides a high-level output. The value of the current as a whole does not become large. In the conventional system, a current is passed through the gate on the non-selected side. Thus, when the number of gates is "n" (n is an integer), the required current becomes "n−1" times that of the current i which flows through one gate, and the value of this current i cannot be made too large. Thus, flowing a large current by decreasing the gate resistance (resistances of transistor TW$_5$, resistor R$_{x4}$ and the like), the rising characteristic of the word line W$_0$, that is, the base potential V$_x$ of the transistor (word driver) TW$_3$, can be improved.

Moreover, the amplitude of the potential V$_x'$ can be of any value as long as the current switch comprising the transistor TW$_6$ and the like is operational. As shown in FIG. 4, the amplitude of the potential V$_x'$ can be smaller than the amplitude of the potential V$_x$ (approximately 0.4 volts is sufficient), and hence the amplitudes of the decoder lines A$_0$, $\overline{A_0}$, A$_1$, and $\overline{A_1}$ are small. Accordingly, an even faster high-speed operation can be anticipated.

Figure 5:
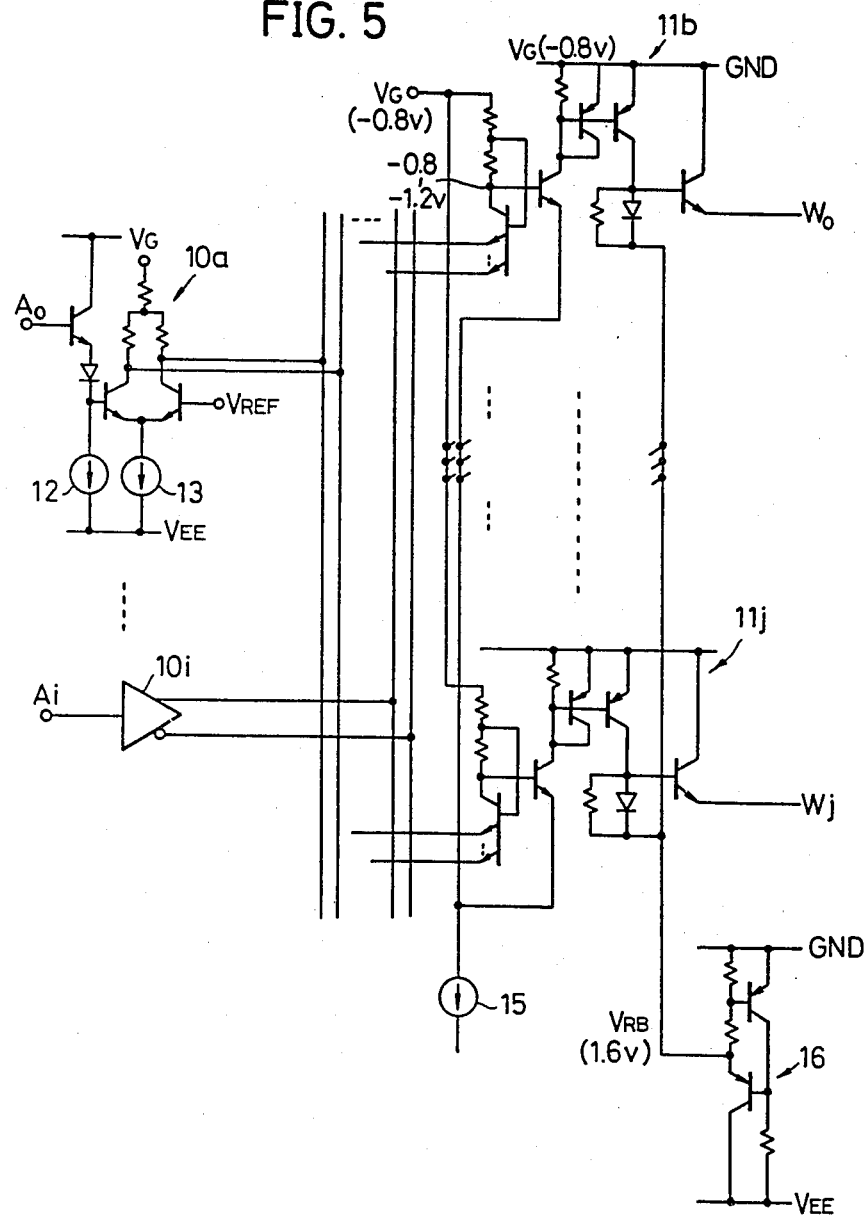
FIG. 5 is a generalized circuit diagram of the decoder circuit of FIG. 3.
Figure 6:
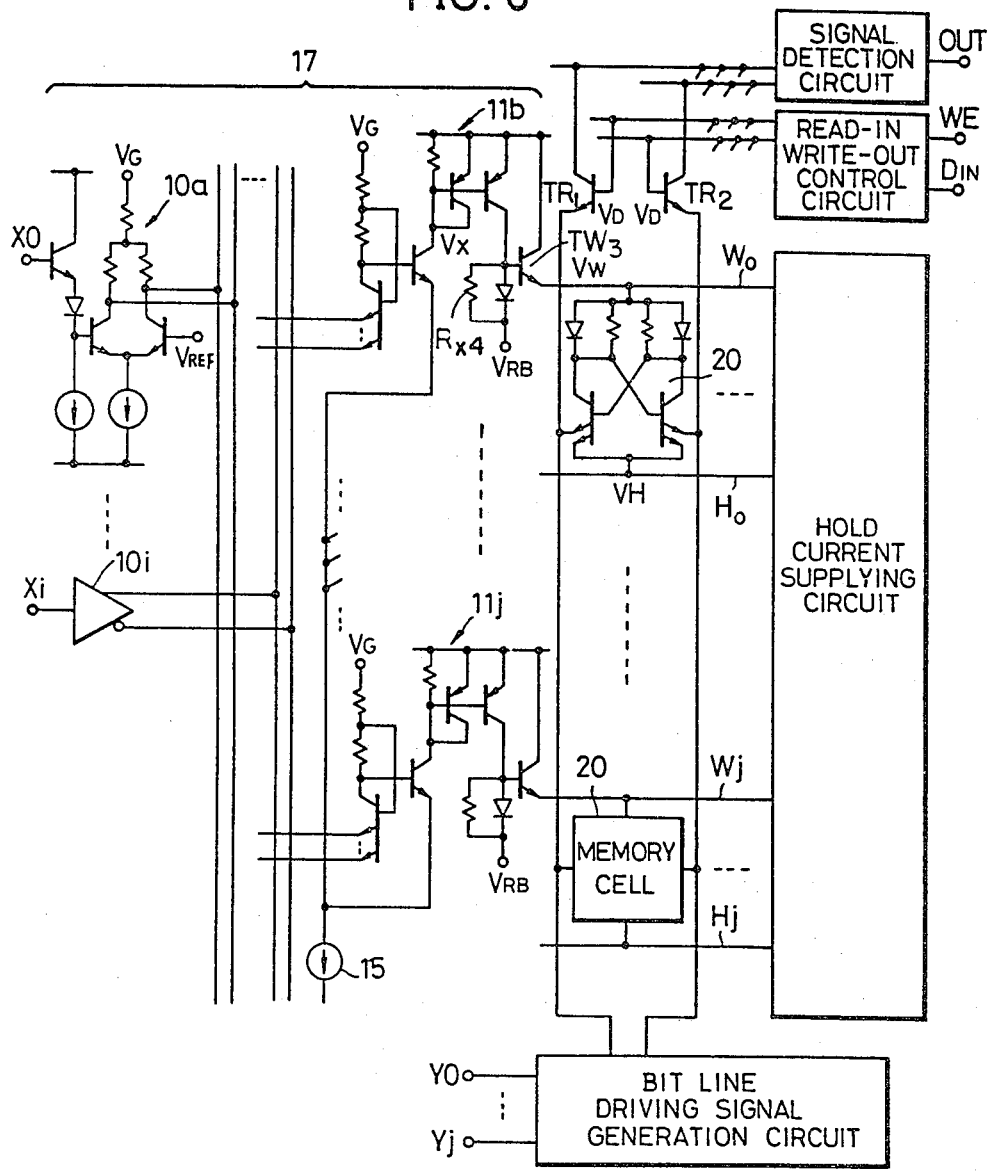
FIG. 6 is a circuit diagram of an example showing the decoder circuit of FIG. 5 applied as a decoder driver in a semiconductor memory device.

FIG. 5 shows a generalized version of the circuit of FIG. 3, in which input signal bits A$_0$, A$_1$, A$_2$, - - -, Ai are assumed. FIG. 6 shows an embodiment which uses the decoder circuit of FIG. 5 as a word line driving signal generation circuit (decoder driver) 17, to select a specific semiconductor memory. In FIG. 6, the embodiment comprises a memory cell 20 which comprises a memory cell array, hold lines $H_0$ through $H_j$ that form pairs with the word lines $W_0$ through $W_j$, and transistors $TR_1$ and $TR_2$ for read/write operations. In this circuit, a selection current superpositioned with a holding current flows when the level of the base of the transistor (word driver) $TW_3$ becomes high, and thus a relatively high current flows to the base of the transistor $TW_3$. In order to keep supplying the above current and increase the base potential $V_x$ at the same time, it is quite effective to flow a current through the resistor $R_{x4}$ in a slightly over driven state. That is, the rising characteristic is improved (faster rise characteristic is obtained) by using the decoder circuit of the present invention shown in FIG. 5 as the decoder driver 17 of FIG. 6, than using the decoder circuit of FIG. 1. Especially when the capacity of the memory MEM increases, the capacitance introduced in the word lines $W_0$ through $W_j$ increases, increasing the load on the transistor (word driver) $TW_3$ side. Hence, the present invention is very effective in that this load is non-existent from the input side of the transistor (word driver) $TW_3$.

Figure 7:
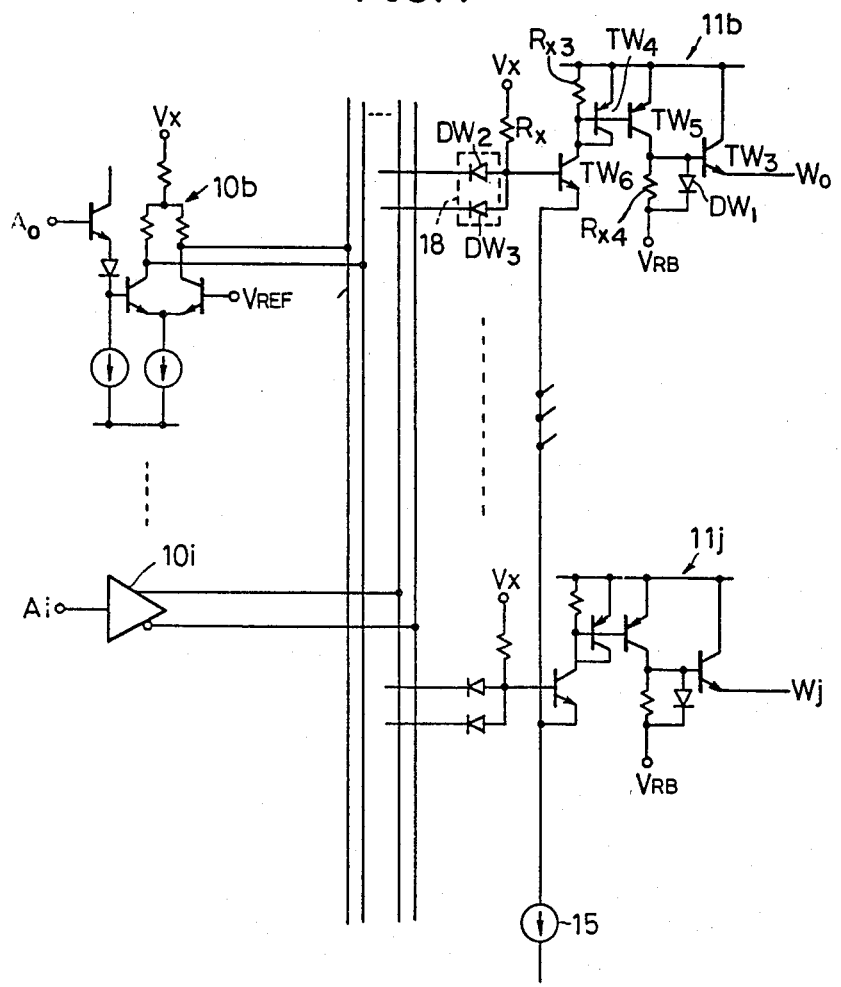
FIG. 7 is a circuit diagram showing another embodiment of a decoder circuit of the present invention.

FIG. 7 shows another embodiment of a decoder circuit of the present invention. In FIG. 7, the differing point from the circuits of FIGS. 3 and 5 is that the AND-circuit 18 of the output gates 11a through 11j are constructed of diodes $DW_2$ and $DW_3$ (diode matrix type). The remaining parts are the same and thus their description will be omitted.

Figure 8:
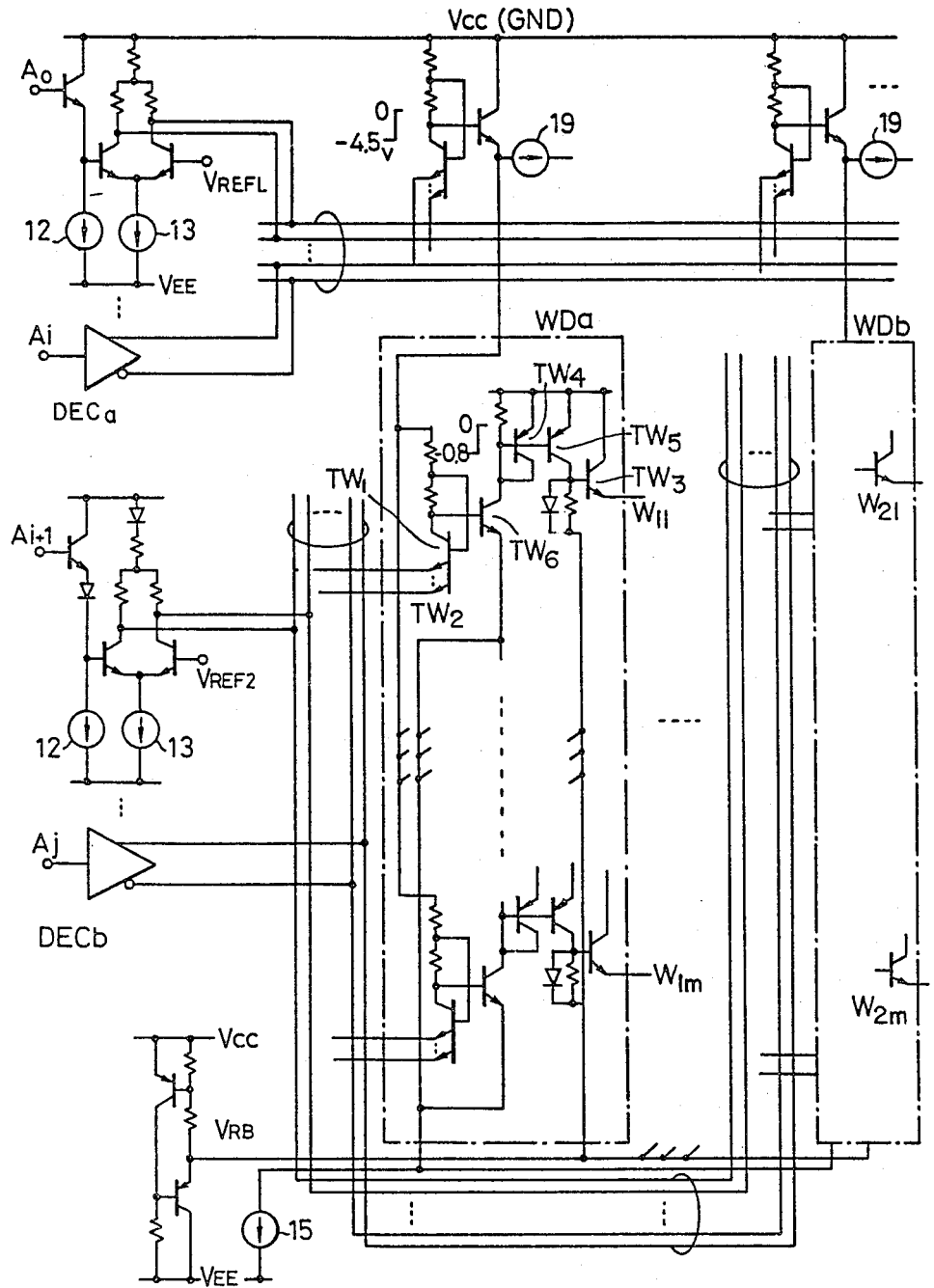
FIG. 8 is a circuit diagram showing an example of a two-step decoder connected to the decoder circuit of the present invention.

FIG. 8 shows an application of the decoder circuit of the present invention to a two-stage decoder. In FIG. 8, address signal bits are divided into a first group comprising address signal bits $A_0$ through $A_i$, and a second group comprising address signal bits $A_{i+1}$, through $A_j$. Word lines (accordingly, word drivers as well) $W_{11}$ through $W_{1m}$, $W_{21}$ through $W_{2m}$, - - -, are divided into "$i+1$" groups of $WD_a$, $WD_b$, - - -, each having "m" ($m=j-i-1$) lines. A group of decoders, $DEC_a$ which receives addresses $A_0$ through $A_i$ performs the selection of the word driver groups $WD_a$, $WD_b$, - - -, and a group of decoders $DEC_b$ which receives the addresses $A_{i+1}$ through $A_j$ supplies address signals and their inverse signals to each of the word drivers, and selects each of the word drivers. Accordingly, the decoder circuit of the present invention, as shown within the word driver group $WD_a$ of FIG. 8, can be applied to a two-stage (or three-stage decoders.

Further, this invention is not limited, to these embodiments but various variations and modifications may be made without departing from the scope of the invention.

What is claimed is:

1. A decoder circuit, operatively connectable to receive a plurality input signals "$a_0, a_1, a_2, - - -, a_i$" and to a word line, comprising:
    input gates, operatively connectable to receive the plurality of input signals "$a_0, a_1, a_2, - - -, a_i$", for generating inverse signals "$\bar{a}_0, \bar{a}_1, \bar{a}_2, - - -, \bar{a}_i$" in dependence upon the plurality of input signals "$a_0, a_1, a_2, - - -, a_i$";
    a logic circuit, operatively connected to said input gates, for generating an output in dependence upon combined input signals that are the combination signals of said signals $a_0$ through $a_i$ and $\bar{a}_0$ through $\bar{a}_i$;
    an output gate, operatively connected to said logic circuit and operatively connectable to the word line, for selectively driving the word line by the output supplied from said logic circuit; and
    current control means, electrically connected between a voltage source and said output gate, for switching a current from said voltage source and activating said output gate.

2. A decoder circuit as claimed in claim 1, wherein said current control means comprises a PNP transistor.

3. A decoder circuit as claimed in claim 1, wherein said logic circuit comprises a multi-emitter transistor comprising an AND-circuit.

4. A decoder circuit as claimed in claim 1, wherein said decoder circuit further comprises:
    voltage clamping means, operatively connected to said output gate, for clamping an input voltage of said output gate; and
    biasing means, electrically connected to said voltage clamping means, for biasing said output gate.

5. A decoder circuit for a word line, operatively connectable to receive input bit signals, said decoder circuit comprising:
    an input gate, operatively connectable to receive the input bit signals, for generating gate signals and inverted gate signals;
    a logic gate, operatively connected to said input gate, for generating a logic signal in dependence upon predetermined ones of the gate signals and the inverted gate signals;
    a current switch, operatively connected to said logic gate, for passing current therethrough in dependence upon the logic signal;
    current control means, operatively connected to said current switch at a first node, for controlling current flow in dependence upon the current from said current switch; and
    a word line driver, operatively connected to said current control means at a second node, for driving the word line.

6. A decoder circuit as claimed in claim 5, wherein said current control means comprises a transistor operatively connected to said current switch and to said word line driver.

7. A decoder circuit as claimed in claim 5, further comprising a constant voltage circuit, operatively connected to the first node, for generating a constant voltage.

8. A decoder circuit as claimed in claim 5, wherein said word line driver has an input, said decoder circuit further comprising:
    a parallel circuit operatively connected to the second node; and
    a biasing circuit operatively connected to said parallel circuit, so that the input of said word line driver is maintained at a predetermined voltage.

9. A decoder circuit as claimed in claim 5, wherein said logic gate comprises an AND gate operatively connected to said input gate and to said current switch.

10. A decoder circuit as claimed in claim 5, wherein said logic gate comprises a multiemitter transistor operatively connected to said input gate and to said current switch.

11. A decoder circuit as claimed in claim 5, wherein said logic gate comprises a pair of diodes operatively connected between said input gate and said current switch.

* * * * *

UNITED STATES PATENT AND TRADEMARK OFFICE
CERTIFICATE OF CORRECTION

PATENT NO. : 4,394,657

DATED : July 19, 1983

INVENTOR(S) : Hideaki Isogai et al

It is certified that error appears in the above-identified patent and that said Letters Patent is hereby corrected as shown below:

Front page, after "[22] Filed: December 18, 1980", insert --[30] Foreign Application Priority Data
December 21, 1979 [JP] Japan.............54-166593--.

Column 5, line 6, "applied" should be --supplied--;

line 7, "introduced" should be --introduces--.

Signed and Sealed this

Twenty-ninth Day of January 1985

[SEAL]

Attest:

DONALD J. QUIGG

Attesting Officer   Acting Commissioner of Patents and Trademarks